(12) United States Patent
Pikulski

(10) Patent No.: US 7,422,141 B2
(45) Date of Patent: Sep. 9, 2008

(54) MICROPARTICLE LOADED SOLDER PREFORM ALLOWING BOND SITE CONTROL OF DEVICE SPACING AT MICRON, SUBMICRON, AND NANOSTRUCTURE SCALE

(75) Inventor: Joseph L. Pikulski, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 100 days.

(21) Appl. No.: 10/762,901

(22) Filed: Jan. 22, 2004

(65) Prior Publication Data

US 2005/0161489 A1  Jul. 28, 2005

(51) Int. Cl.
B23K 35/14 (2006.01)
B23K 31/02 (2006.01)

(52) U.S. Cl. ...................... 228/56.3; 228/245
(58) Field of Classification Search ............... 228/56.3, 228/248.1
See application file for complete search history.

(56) References Cited

U.S. PATENT DOCUMENTS

| 4,058,387 | A | * | 11/1977 | Nofziger | 65/32.2 |
| 5,089,356 | A | * | 2/1992 | Chung | 428/608 |
| 5,346,775 | A | * | 9/1994 | Jin et al. | 428/614 |
| 5,394,609 | A | * | 3/1995 | Ferguson et al. | 29/840 |
| 5,427,865 | A | * | 6/1995 | Mullen et al. | 428/559 |
| 5,803,340 | A | * | 9/1998 | Yeh et al. | 228/56.3 |

(Continued)

FOREIGN PATENT DOCUMENTS

EP   0795891 A2   3/1997

(Continued)

OTHER PUBLICATIONS

Senju Metal Industry Co., Ltd; Sparkle Ball; web page http://www.senju-m.co.jp/e/product/bga; printed Jul. 19, 2003; 1 page.

(Continued)

*Primary Examiner*—Kiley Stoner
(74) *Attorney, Agent, or Firm*—Christopher R. Balzan, Esq.

(57) ABSTRACT

In one embodiment, a solder preform includes a solder matrix having microparticles secured with the solder matrix. The microparticles are constructed so as to be capable of arranging during a solder bonding process so as to provide a uniform separation between opposing soldered surfaces. The microparticles may be shaped to inhibit stacking of the microparticles while self arranging during the solder bonding. The solder preform may have an amount of microparticles with respect to the solder matrix to inhibit stacking of the microparticles during the solder bonding process. Microparticles may be spheres, powders, polyhedrons, crystalline particles, nanostructures, or the like, which may be capable of conducting electric current, or may be dielectric material; for example glass, plastic, metal, or semiconductor material. In one implementation microparticle loaded solder preform may be fabricated by selecting microparticles capable of self arranging within a solder alloy so as to provide a uniform separation between opposing solder surfaces during a solder bonding process, combining the microparticles with the solder alloy, and forming a solder preform having a solder matrix with the microparticles embedded therein. This may include mixing the microparticles and solder alloy by shaking, folding, stirring, pressing, or rolling. Some implementations, may include tailoring a coefficient of expansion of the solder preform by selecting and combining appropriate microparticles with the solder alloy.

40 Claims, 2 Drawing Sheets

U.S. PATENT DOCUMENTS

| | | | |
|---|---|---|---|
| 2004/0035909 A1* | 2/2004 | Yeh et al. | 228/56.3 |
| 2004/0134976 A1* | 7/2004 | Keyser et al. | 228/248.1 |
| 2004/0165362 A1* | 8/2004 | Farnworth | 361/764 |
| 2005/0034791 A1* | 2/2005 | Lee et al. | 148/400 |
| 2005/0253261 A1* | 11/2005 | Farnworth | 257/734 |
| 2006/0011703 A1* | 1/2006 | Arita et al. | 228/56.3 |
| 2007/0152016 A1* | 7/2007 | Choe et al. | 228/56.3 |

FOREIGN PATENT DOCUMENTS

EP 0795891 A2 * 3/1997

OTHER PUBLICATIONS

Sekisui Chemical Co., Ltd; Micropearl SOL (Conductive Fine Particles); web page http://i-front.sekisui.co.jp/fc/eng/html/jissou/product/jipr_01.html ; printed Jul. 20, 2003; 1 pages.

Sekisui Chemical Co., Ltd; Micropearl SOL (Conductive Fine Particles); web page http://i-front.sekisui.co.jp/fc/eng/html/jissou/product/jipr_02.html; printed Jul. 19, 2003; 2 pages.

Sekisui Chemical Co., Ltd; Micropearl SOL (Conductive Fine Particles); web page http://i-front.sekisui.co.jp/fc/eng/html/jissou/product/jipr_04.html; printed Jul. 20, 2003; 3 pages.

Sekisui Chemical Co., Ltd; Micropearl SOL (Conductive Fine Particles) Appication; web page http://i-front.sekisui.co.jp/fc/eng/html/jissou/product/jipr_06.html; printed Jul. 20, 2004; 2 pages.

Sekisui Chemical Co., Ltd; Micropearl SOL (Conductive Fine Particles) composition and prpdu . . . ; web page http://i-front.sekisui.co.jp/fc/eng/html/jissou/product/jipr_07.html; printed Jul. 20, 2003; 1 page Sekisui Chemical Co., Ltd; Fine Chemicals Division, Assembly; web page http://i-front.sekisui.co.jp/fc/eng/html/jissou/product/ji_01.html; printed Jul. 20, 2003; 1 page.

Sekisui Chemical Co., Ltd; LCD Spacer (High Precision Type); web page http://i-front.sekisui.co.jp/fc/eng/html/lcd/product/pr_01.html; printed Jul. 20, 2003; 1 page.

Sekisui Chemical Co., Ltd; LCD Spacer (Silica Type); web page http://i-front.sekisui.co.jp/fc/eng/html/lcd/product/pr_04.html; printed Jul. 20, 2003; 1 page.

* cited by examiner

MICROPARTICLE LOADED SOLDER PREFORM ALLOWING BOND SITE CONTROL OF DEVICE SPACING AT MICRON, SUBMICRON, AND NANOSTRUCTURE SCALE

BACKGROUND

In the manufacture of flip-chip devices, integrated circuits with active surfaces are often positioned with die bonding machines. Die bonders have settings that allow control of the depth of the die placement head. If the machine is not calibrated properly, the machine could push the device too hard onto the mating surface. This could crush or otherwise damage active surface devices as well as solid state electrical devices.

Further, in capacitive sensitive devices, if the die is not level, i.e. one side of the device is closer than another, or the gap spacing between the die and the substrate is not otherwise conforming, capacitive effects between the die and the substrate may cause deviation in the performance of the device from its modeled operation.

Precise tolerances are of particular importance in microwave devices, RF MEMS, or other capacitive loaded devices, such as for example cantilever accelerometers (where precise and parallel spacing of the cantilever from the substrate allows more effective voltage measurements). Moreover, the further away that the device is from the substrate, the greater the capacitance, and thus, the greater the loss factor. If the tolerances were more precise and the capacitive loading more uniform, the loss factor could be reduced. Further, more precise modeling of the capacitive effects could be obtained to improve performance.

Die bonding machines, however, have limited tolerances within which they can mate chips. Attaining precision micron and submicron dimensions placement is not readily obtainable with die bonding machines.

The smaller dimensions (micron and submicron), however, are becoming an every day requirement in the high speed semiconductor manufacturing process. One technique to provide these smaller dimensions is a photolithograph process of etching physical stops on the integrated circuit itself. Although physical stops can be etched to provide submicron tolerances, such a process can increase the time and costs associated with chip processing.

Solder plated metal spheres and/or solder plated plastic spheres can be employed to provide gap control where larger gap spacing is acceptable, such as between an integrated circuit package and a printed wire board. Conventional solder plated metal spheres and solder plated plastic spheres, however, do not easily provide gap control in the micron and submicron range. Additionally, the manufacture of solder plated spheres can be a costly process.

SUMMARY

In one embodiment of the present invention, a solder preform is provided which includes a solder matrix having microparticles secured with the solder matrix. The microparticles are constructed so as to be capable of arranging during a solder bonding process so as to provide a uniform separation between opposing soldered surfaces.

In certain embodiments, the microparticles are shaped so as to inhibit stacking of the microparticles while they self arrange during the solder bonding process. In certain embodiments the solder preform has an amount of microparticles with respect to the solder matrix so as to inhibit stacking of the microparticles during the solder bonding process.

In some embodiments the microparticles may include, for example, spheres, powders, polyhedron particles, powders, crystalline particles, or nanostructures. The microparticles may be capable of conducting electric current, or may be a dielectric material. Some embodiments include microspheres of glass, plastic, metal, or semiconductor material. Embodiments are not limited to these materials or shapes.

In one implementation of the present invention, a method is provided for fabricating microparticle loaded solder preform. The implementation may include selecting microparticles capable of self arranging within a solder alloy so as to provide a uniform separation between opposing solder surfaces during a solder bonding process. The implementation may include combining the microparticles with the solder alloy and forming a solder preform having a solder matrix with the microparticles embedded therein. Certain implementations may include mixing the microparticles with the solder alloy by shaking, folding, stirring, pressing, or rolling.

Some implementations, may include tailoring a coefficient of expansion of the solder preform by selecting and combining appropriate microparticles with the solder alloy. Thus, in one implementation, selecting and combining includes tailoring a coefficient of expansion of the solder preform such that a combined coefficient of expansion of the microparticles and the solder matrix is in a range between the coefficients of expansion of the opposing soldered surfaces.

DESCRIPTION

Figure 1:
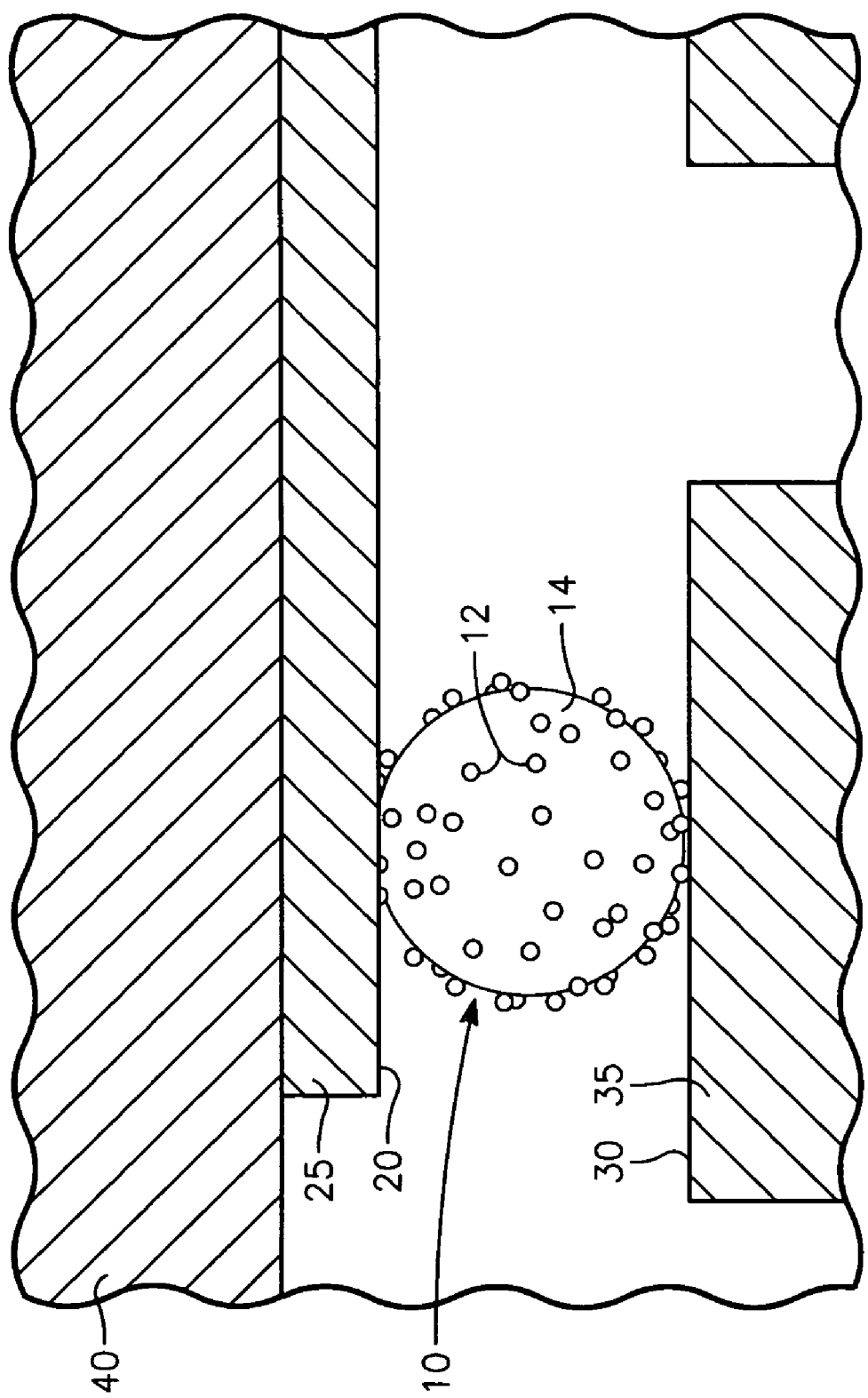
FIG. 1 illustrates a cross sectional view of a solder preform between bonding surfaces prior to solder bonding.

FIG. 1 illustrates a cross sectional view of a solder preform 10, which may be used in a solder bonding process for solder bonding two bonding surfaces 20 and 30. For example, the bonding surface 20 may be part of a conductive pattern 25 on a die 40, and the bonding surface 30 may be part of a conducive pattern 35 on a substrate (not show in FIG. 1). The different embodiments and implementations of the present invention are not limited to the example application and its specific configuration. Many other applications and configurations are possible.

The solder preform 10 has microparticles 12 held in a solder matrix 14. As discussed further below, the microparticles 12 may be distributed uniformly throughout the solder matrix 14 or distributed non-uniformly throughout the solder matrix 14. For example the microparticles 12 may be sandwiched within the solder matrix 14, or they may be held at the exterior surface of the solder matrix 14. Although shown shaped as a ball in FIG. 1 for illustration purposes, the solder preform 10 may be shaped as a strip, ribbon, sheet, wire, rod, chip, cube, pellet, slug, or other shape. As is disclosed further below, the selected manufacturing technique may lend itself to a particular shape. Or, the manufacturing may include additional shaping, or molding, if desired.

Figure 2:
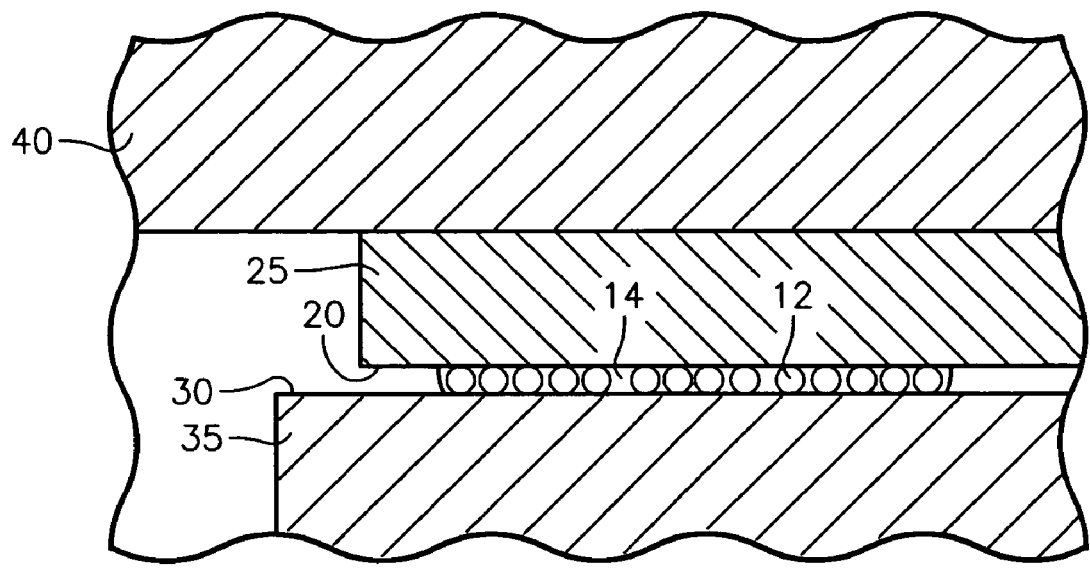
FIG. 2 illustrates a cross sectional view of the solder preform of FIG. 1 after solder bonding.

FIG. 2 illustrates a cross sectional view of the solder preform 10 of FIG. 1 after solder bonding. As the bonding surfaces 20 and 30 approach each other during the bonding process, the microparticles 12 self align in the solder matrix 14 to provide a uniform distance between the bonding surfaces 20 and 30, as shown in FIG. 2. The microparticles 12 may be shaped and sized so as to be capable of arranging to provide a generally uniform separation between two opposing soldered surfaces 20 and 30 as the solder matrix 14 is melted during a solder bonding process.

As shown in FIGS. 1 and 2, the microparticles 12 may be microspheres. Microspheres resist stacking as they align during the solder bonding process. Other forms are possible. For example, generally regular particles such as a pyramidal, tetrahedral, or other polyhedral forms, crystalline particles, powders, or the like, or other generally uniformly sized particles (symmetrical or asymmetrical), which preferably resist stacking, may be utilized.

Furthermore, a ratio of microparticles 12 with respect to solder matrix 14 is selected to inhibit stacking of the microparticles 12 during the bonding process and to ensure that a generally uniform separation is achieved. The size and variance of the microparticles 12 is selected to provide the desired separation.

In some embodiments, the microparticles 12 may be composed of a material that will not alloy with the solder. In certain embodiments, the microparticles 12 are composed of a material that will not melt rapidly if the solder matrix 14 is kept below the alloying temperature. The composition of the microparticles 12 may be selected based on the relative melting points between the solder matrix 14 and the microparticles 12, and/or based on the specific utilization. The solder preform 10 may be loaded with microparticles 12 having specific electrical and/or mechanical characteristic required for a particular application. Also, microparticles 12 of different types and/or characteristics may be combined in the preform 10, if desired. For example, microparticles 12 capable of providing a solder bond with excellent impedance may be embedded in the solder matrix 14 along with microparticles 12 capable of providing a solder bond with superior stress and/or thermal properties.

Figure 3:
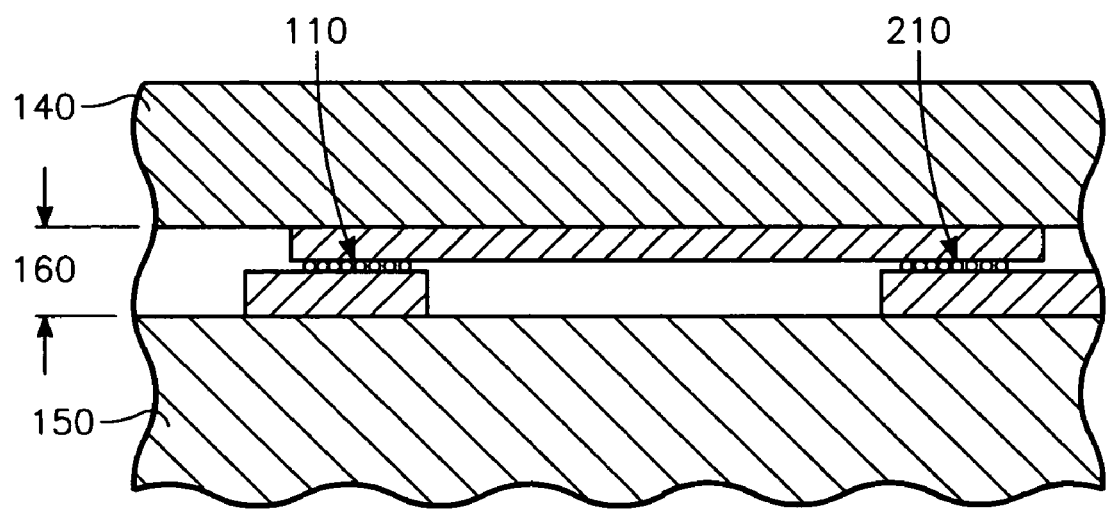
FIG. 3 illustrates a cross sectional view of a die and substrate with multiple bond sites after solder bonding using the solder preforms.

Microparticle loaded preform 10 can allow the spacing between the substrate (not shown in FIG. 1) and the die 40 to be accurately controlled. If there are multiple bond sites 110 and 210 as shown in FIG. 3, solder preforms (not shown) may be utilized for controlling the spacing 160 between the die 140 and the substrate 150. Thus, it allows the tolerances between the structures and/or features (not shown) on the die 140 and/or the substrate 150 to be more precisely defined.

In some implementations, the solder preform 10 may be placed on a bonding surface prior to placement of the die. For example, in one implementation, the solder preform 10 may be deposited on the solder sites of the die, and thereafter, the die may be flipped and mounted on a substrate as part of a flip-chip process. In another implementation, the solder preform 10 may be melted and flowed to the bond site.

When solder is plated-up in a manufacturing process, grain boundaries are established during the plating process. In implementations where the solder preform 10 is first fused to one of the bonding surfaces, and then remelted when the two surfaces are soldered together, the remelting of the grain boundaries causes surface tension effects in the solder alloy which can pull the bonding surfaces closer together. The microparticles 12 help mitigate these surface tension effects and control the extent that the bonding surfaces are pulled toward each other during the remelting.

In some situations, after a die has been soldered to the substrate, there can be a tendency for the solder to pull away if the solder has a different coefficient expansion than the substrate, or if there is a great disparity in the coefficient of expansions between the substrate and the die. In some situations, the microparticles 12 may be used to mitigate effects caused by any differential in the coefficient of expansion between the bonding surfaces, or between a bonding surface and the solder bond. Thus, the solder preform 10 may be loaded with microparticles 12 to provide for spacing, and/or to tailor the expansion. In some embodiments, it is possible to bridge the expansion between the two bonding surfaces. If there is no appropriate solder alloy available, the microparticles 12 may be selected to provide an acceptable expansion gradient between two (or more) structures, such as for example between a printed circuit board and a die. The solder composite may have some expansion between that of the two structures.

For example, referring to FIG. 1, microparticles 12 with a lower coefficient of expansion than the solder matrix 14 may be used to lower the coefficient of expansion of the resulting solder bond so that the resulting solder bond has a coefficient of expansion located in a range midway between bonding surfaces 20 and 30, if desired. Similarly, microparticles 12 with a higher coefficient of expansion than the solder matrix 14 may be included to raise the coefficient of expansion of the resulting solder bond, so that the resulting solder bond has a coefficient of expansion with a value within a range that is close to that of one, or both bonding surfaces 20 and/or 30. Furthermore, an amount of microparticles 12 is added that will provide a desired amount of change (lowering or raising) of the coefficient of expansion of the resulting solder bond. Thus, it is possible in some embodiments, to mitigate effects of the coefficient of expansion differential by loading different microparticles 12 in the solder preform 10.

Being able to tailor the expansion of the solder preform 10 expands the possible types of solder alloys that may be utilized in a particular application. For example, a particular solder alloy that has a desirable electrical, bonding, or other property for a particular application may be selected despite a less desirable coefficient of expansion of the solder alloy. This is because microparticles 12 may be added to the solder preform 10 to improve the coefficient of expansion of the resulting solder bond.

Certain embodiments may include microparticles 12 that include a conductor material, a semiconductor material, and/or a dielectric material. The microparticles 12 may include materials comprising, such as for example, copper, gold, aluminum, molybdenum, silicon, gallium, carbon, glass, ceramic, plastic, metal alloys, semiconductor compounds, silastic elastomers (for example SYLGARD 184, by Dow Corning, Midland, Mich., http://www.dowcorning.com), or other elastomers, or the like. The foregoing are but a few examples. Many other materials are possible.

In one example embodiment, molybdenum spheres, or molybdenum powder, may be utilized so long as the range of distribution of molybdenum particles is within the range of desired separation. The desired particle size may be obtained by separation techniques. Screening, for example, may be used as a separation technique. In some situations particles smaller than the desired separation distance may be allowable. This is because the largest particles, rather than the smaller particles, set the separation distance. So long as there is a sufficient amount of the largest sized particles present to provide the desired separation distance.

Moreover, different ratios of solder alloy to microparticles 12 may be provided to tailor coefficient of thermal expansion for a particular application. In one embodiment, the ratio may be 45% solder 55% molybdenum spheres, while in another embodiment the ratio may be 25% solder 75% molybdenum spheres, for example.

The microparticles 12 referred to herein are small-scale particles, which in some embodiments of the present invention, may include and/or be submicron particles, including millimicron or nanometer sized, such as for example nanostructures. Thus, in some embodiments, the microparticles 12 include particles that are sized in a range from about a micron to a fraction of a micron. In some embodiments, the microparticles 12 are sized on the order of a millimicron.

Some embodiments are capable of use for load leveling and height control in flip chip devices, such as for example nano circuits, MEMS (optical, mechanical, or RF), or in other devices. Compression bonding is often performed to bond the conductive paths of the die with the conductive paths of the substrate. In this process, microparticles 12 can act as spacers, which facilitate distribution and alignment of bonding pressure so as to inhibit crushing of the device or the substrate. Also, in certain embodiments, the microparticles 12 may be resilient to mitigate any possible over pressure, or improper distancing, by a compression bonder.

Fabricating Microparticle Loaded Solder Preforms

The solder preform 10 may be fabricated by various manufacturing techniques. For example, in one implementation, the microparticles 12 are combined with melted solder alloy and mixed, such as by shaking. In one implementation, the microparticles 12 are mixed with melted solder alloy to form a slurry which is cooled to form the solder preforms. In another implementation, a mixture of microparticles 12 and liquid solder alloy is splat cooled against a surface, and then diced, or molded to a desired shape.

In yet another implementation, the microparticles 12 mixed with the solder alloy by folding the microparticles 12 into the solder alloy, similar to the manner in which taffy is folded. Or, the microparticles 12 may be mixed with the solder alloy at near its melting point, similar to mixing chocolate chips into cookie dough.

In still other implementations, the microparticles 12 are attached to the surface of the solder alloy. The microparticles 12 may be pressed into the surface of the solder alloy. For example, softened solder alloy may be rolled over microparticles 12, or a solder sheet may be pressed onto microparticles 12 so that the solder sheet captures the microparticles 12. The solder sheet with embedded microparticles 12 may be diced into preform strips or squares, for example. A uniform distribution of balls is not required in all embodiments, so long as there is enough particles in the preform 10 to provide the desired characteristic in the resulting bond.

The manufacturing technique chosen from the above implementations will be dependent in part on the type of microparticle used, and in some situations, by the desired shape of the preform 10. For example, if the microparticles 12 suspend well in liquid solder alloy, the microparticles 12 may be mixed with liquid solder and then poured into molds if desired. If the microparticles 12 do not mix well, for example they do not suspend well in liquid solder, the particles may be mixed with semi-solid solder alloy, such as by folding. Or, the liquid and particles may be rapidly cooled while the particles are still suspended, such as by splat cooling. After folding, or splat cooling, or pressing, the solder matrix 14 may be formed into preforms by, for example, dicing, swaging, extruding, or the like.

Having described this invention in connection with a number of embodiments and implementations, modification will now certainly suggest itself to those skilled in the art. As such, the invention is not to be limited to the disclosed embodiments except as required by the appended claims.

What is claimed is:

1. A solder preform comprising:
   a) a solder matrix comprised of a solder alloy forming the solder preform;
   b) microparticles embedded in the solder alloy;
   c) the microparticles being constructed so as to be capable of arranging during a solder bonding process so as to provide a substantially uniform separation between opposing soldered surfaces; and
   d) wherein the microparticles comprise polyhedrons.

2. The solder preform of claim 1 wherein the microparticles are shaped so as to inhibit stacking while self arranging during a solder bonding process.

3. The solder preform of claim 1 comprising an amount of microparticles with respect to an amount of the solder alloy so as to inhibit stacking of the microparticles during a solder bonding process.

4. The solder preform of claim 3 wherein the microparticles are shaped so as to inhibit stacking while self arranging during a solder bonding process.

5. The solder preform of claim 4 wherein the microparticles comprise one of: (a) a pyramidal shape or (b) a tetrahedral shape.

6. The solder preform of claim 5 wherein the microparticles comprise at least one of: (a) glass; (b) plastic; (c) elastomer; (d) metal; (e) semiconductor; (f) material capable of conducting electric current; or (g) dielectric material.

7. The solder preform of claim 1 wherein the microparticles comprise at least one of: (a) glass; (b) plastic; (c) elastomer; (d) metal; (e) semiconductor; (f) material capable of conducting electric current; or (g) dielectric material.

8. The solder preform of claim 7 wherein the microparticles comprise generally regular particles.

9. The solder preform of claim 8 wherein the microparticles comprise at least one of:
   (a) a pyramidal structure or (b) a tetrahedral structure.

10. The solder preform of claim 1 wherein the microparticles comprise at least one of: (a) a pyramidal structure, or (b) a tetrahedral structure.

11. The solder preform of claim 1 wherein the microparticles have a coefficient of expansion such that a combined coefficient of expansion of the microparticles and the solder alloy is in a range between the opposing soldered surfaces.

12. The solder preform of claim 1 wherein the microparticles have a coefficient of expansion lower than a coefficient of expansion of the solder alloy.

13. The solder preform of claim 1 wherein the microparticles have a coefficient of expansion higher than a coefficient of expansion of the solder alloy.

14. The solder preform of claim 1 wherein the microparticles have a coefficient of expansion substantially the same as a coefficient of expansion of the solder alloy.

15. The solder preform of claim 1 wherein the microparticles are distributed substantially uniformly through the solder alloy.

16. The solder preform of claim 1 wherein the microparticles are embedded near an exterior surface of the solder alloy.

17. The solder preform of claim 1 wherein the microparticles are embedded in an exterior surface of the solder alloy.

18. A solder preform comprising:
   a) a solder matrix forming the solder preform, the solder matrix comprising a solid solder alloy; and
   b) a plurality of stack resistant crystal structure spacers having a substantially similar height embedded within the solid solder alloy.

19. The solder preform of claim 18 wherein the plurality of stack resistant crystal structure spacers comprise at least one of: (a) tetrahedrons; or (b) pyramids.

20. The solder preform of claim 18 wherein the plurality of stack resistant crystal structure spacers have a coefficient of expansion such that a combined coefficient of expansion of the plurality of stack resistant crystal structure spacers and the solid solder alloy is in a range between the coefficients of expansion of the opposing soldered surfaces.

21. A solder preform comprising:
 a) a plurality of nanostructure spacers embedded within a solder alloy; and
 b) the nanostructure spacers being constructed so as to be capable of arranging during a solder bonding process so at to provide substantially uniform separation between opposing soldered surfaces.

22. The solder preform of claim 21 wherein the nanostructure spacers are shaped so as to inhibit stacking while self arranging during a solder bonding process.

23. The solder preform of claim 21 comprising an amount of nanostructure spacers with respect to an amount of the non-paste solder matrix so as to inhibit stacking of the microparticles during a solder bonding process.

24. The solder preform of claim 23 wherein the nanostructure spacers are shaped so as to inhibit stacking while self arranging during a solder bonding process.

25. The solder preform of claim 24 wherein the nanostructure spacers comprise at least one of: (a) glass; (b) plastic; (c) elastomer; (d) metal; (e) semiconductor; (f) material capable of conducting electric current; or (g) dielectric material.

26. The solder preform of claim 21 wherein the nanostructure spacers comprise at least one of: (a) glass; (b) plastic; (c) elastomer; (d) metal; (e) semiconductor; (f) material capable of conducting electric current; or (g) dielectric material.

27. The solder preform of claim 26 wherein the nanostructure spacer comprise generally regular particles.

28. The solder preform of claim 21 wherein the nanostructure spacers comprise polyhedrons.

29. The solder preform of claim 21 wherein the nanostructure spacers comprise crystalline particles.

30. The solder preform of claim 21 wherein the nanostructure spacers have a coefficient of expansion such that a combined coefficient of expansion of the nanostructure spacers and the solder alloy is in a range between the opposing soldered surfaces.

31. The solder preform of claim 21 wherein the nanostructure spacers have a coefficient of expansion lower than a coefficient of expansion of the solder alloy.

32. The solder preform of claim 21 wherein the nanostructure spacers have a coefficient of expansion higher than a coefficient of expansion of the solder alloy.

33. The solder preform of claim 21 wherein the nanostructure spacers have a coefficient of expansion substantially the same as a coefficient of expansion of the solder alloy.

34. The solder preform of claim 21 wherein the nanostructure spacers are distributed substantially uniformly through the solder alloy.

35. The solder preform of claim 21 wherein the nanostructure spacers are embedded near an exterior surface of the solder alloy.

36. The solder preform of claim 21 wherein the nanostructure spacers are embedded in an exterior surface of the solder alloy.

37. A solder preform comprising:
 c) a non-paste solder matrix forming the solder preform; and
 d) a plurality of stack resistant nanostructure spacers having a substantially similar diameter embedded within the non-paste solder matrix.

38. The solder preform of claim 37 wherein the plurality of stack resistant nanostructure spacers comprises stack resistant nanostructure spacers comprising at least one of: (a) material capable of conducting electric current; or (b) dielectric material.

39. The solder preform of claim 38 wherein the plurality of stack resistant nanostructure spacers has a coefficient of expansion such that a combined coefficient of expansion of the plurality of stack resistant nanostructure spacers and the solder alloy is in a range between the coefficients of expansion of the opposing soldered surfaces.

40. The solder preform of claim 10 wherein the stack resistant nanostructure spacers comprise at least one of: (a) polyhedrons; or (b) crystalline particles.

* * * * *